(12) United States Patent
Grelck

(10) Patent No.: US 7,952,027 B2
(45) Date of Patent: May 31, 2011

(54) CABLE MANAGEMENT SYSTEM

(76) Inventor: Brian Grelck, Hoffman Estates, IL (US)

( * ) Notice: Subject to any disclaimer, the term of this patent is extended or adjusted under 35 U.S.C. 154(b) by 247 days.

(21) Appl. No.: 12/344,691

(22) Filed: Dec. 29, 2008

(65) Prior Publication Data
US 2010/0163278 A1 Jul. 1, 2010

(51) Int. Cl.
H02G 3/04 (2006.01)

(52) U.S. Cl. ............ 174/72 A; 174/480; 174/68.1; 174/95; 174/97; 174/101; 138/111; 439/207

(58) Field of Classification Search .......... 174/72 A, 174/480, 481, 68.1, 68.3, 95, 96, 97, 101, 174/112; 138/111, 162, 168, 113; 439/207
See application file for complete search history.

(56) References Cited

U.S. PATENT DOCUMENTS

| 6,448,497 | B1 | 9/2002 | McCracken et al. | |
|---|---|---|---|---|
| 6,528,728 | B1 * | 3/2003 | Shima | 174/101 |
| 6,646,203 | B1 | 11/2003 | Liao | |
| 6,766,093 | B2 | 7/2004 | McGrath et al. | |
| 6,803,519 | B2 | 10/2004 | de la Borbolla et al. | |
| 6,825,418 | B1 * | 11/2004 | Dollins et al. | 174/112 |
| 7,019,213 | B1 | 3/2006 | McNutt et al. | |
| 7,223,918 | B2 | 5/2007 | Gelibert | |
| 7,247,799 | B2 | 7/2007 | Mori et al. | |

* cited by examiner

Primary Examiner — Dhiru R Patel
(74) Attorney, Agent, or Firm — Barnes & Thornburg LLP

(57) ABSTRACT

A device for managing a plurality of cables in a multi-cable environment includes a stationary member having a plurality of stationary channel portions. At least one movable member is movably secured to the stationary member. The at least one movable member has a plurality of movable channel portions corresponding in number and general configuration to the plurality of stationary channel portions. A plurality of indicia-bearing areas are provided, corresponding in number, and adjacent, to the plurality of stationary channel portions. The at least one moveable member is moveable between a cable placement position in which cables can be placed in the respective stationary channel portions, and a cable retaining position in which the cables are secured in channels formed by the cooperation of the stationary channel portions and the movable channel portions.

8 Claims, 4 Drawing Sheets

CABLE MANAGEMENT SYSTEM

BACKGROUND

The present disclosure relates generally to cables, and specifically to the management of multiple cables associated with electronic devices such as computers, servers, data systems and the like. A variety of accessories have been developed to provide cable management options to meet varying needs. Solutions range from simple cable management rings, to vertical or horizontal organizers, to troughs and ladders.

Cable management accessories presently available present certain deficiencies. Most of these presently available cable management accessories can be classified as "horizontal" cable management devices, which provide a path, or raceway, in which network cables can be run, typically using wire ties or other fastening devices to group similar cables together. These and other known devices consume valuable space in what are often close quarters for data equipment. Further, known devices fail to provide identification of cables at or near their end points. It can thus be seen that the need exists for a simple, efficient, and easily implemented arrangement for managing cables in a data equipment installation.

SUMMARY

According to one aspect of the present disclosure, a device for managing a plurality of cables in a multi-cable environment includes a stationary member having a plurality of stationary channel portions. At least one movable member is movably secured to the stationary member. The at least one movable member has a plurality of movable channel portions corresponding in number and general configuration to the plurality of stationary channel portions. A plurality of indicia-bearing areas are provided, corresponding in number, and adjacent, to the plurality of stationary channel portions. The at least one moveable member is moveable between a cable placement position in which cables can be placed in the respective stationary channel portions, and a cable retaining position in which the cables are secured in channels formed by the cooperation of the stationary channel portions and the movable channel portions.

According to another aspect of the present disclosure, a device for managing a plurality of cables in a multi-cable environment includes a stationary member having a plurality of stationary channel portions and at least one removable member removably secured to the stationary member. The at least one removable member further includes at least one removable channel portion corresponding in general configuration to one of the plurality of stationary channel portions.

There has thus been outlined, rather broadly, the features of the present disclosure. There are, of course, additional features of the present disclosure that will be described hereinafter and which will form the subject matter of the claims appended hereto. Those skilled in the art will appreciate that the conception upon which this disclosure is based, may readily be utilized as a basis for the designing of other structures, methods and systems for carrying out the several purposes of the present disclosure. It is important, therefore, that the claims be regarded as including such equivalent constructions insofar as they do not depart from the spirit and scope of the present disclosure.

BRIEF DESCRIPTION OF THE DRAWINGS

Embodiments of the present disclosure are illustrated by way of example, and not by way of limitation, in the figures of the accompanying drawings in which.

DETAILED DESCRIPTION

Figure 1:
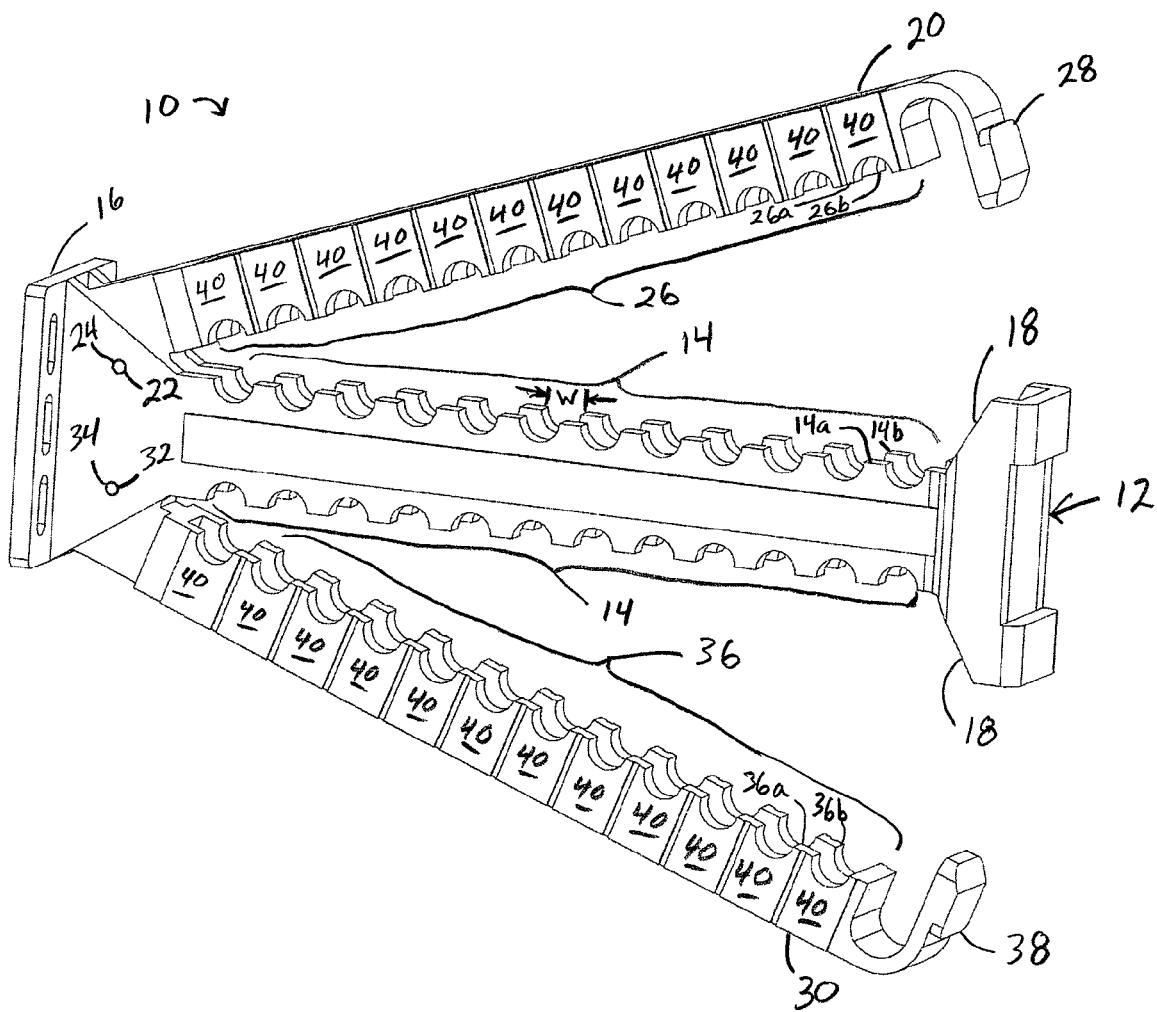
FIG. 1 illustrates a perspective view of an embodiment of a cable management arrangement in accordance with the principles of the present invention in a fully open position.

In the following description, specific details are set forth in order to provide a thorough understanding of the disclosure. However, it will be apparent that the subject matter may be practiced without these specific details. Without departing from the generality of the subject matter disclosed herein and without limiting the scope of the claimed invention, the discussion that follows, will refer to the subject matter as depicted in the drawing.

Figure 2:
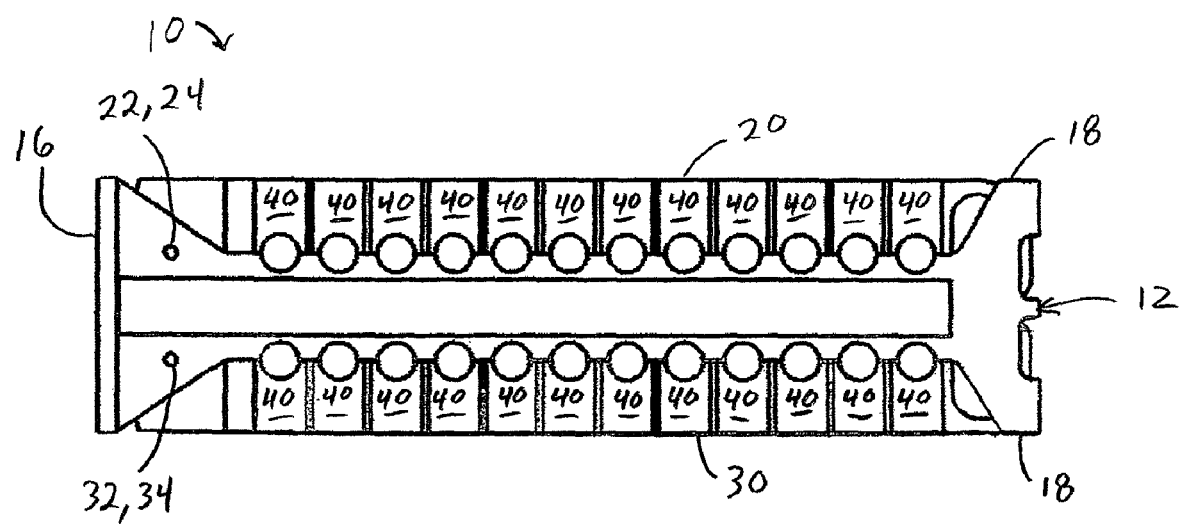
FIG. 2 illustrates the cable management arrangement of FIG. 1 in a closed position.
Figure 3:
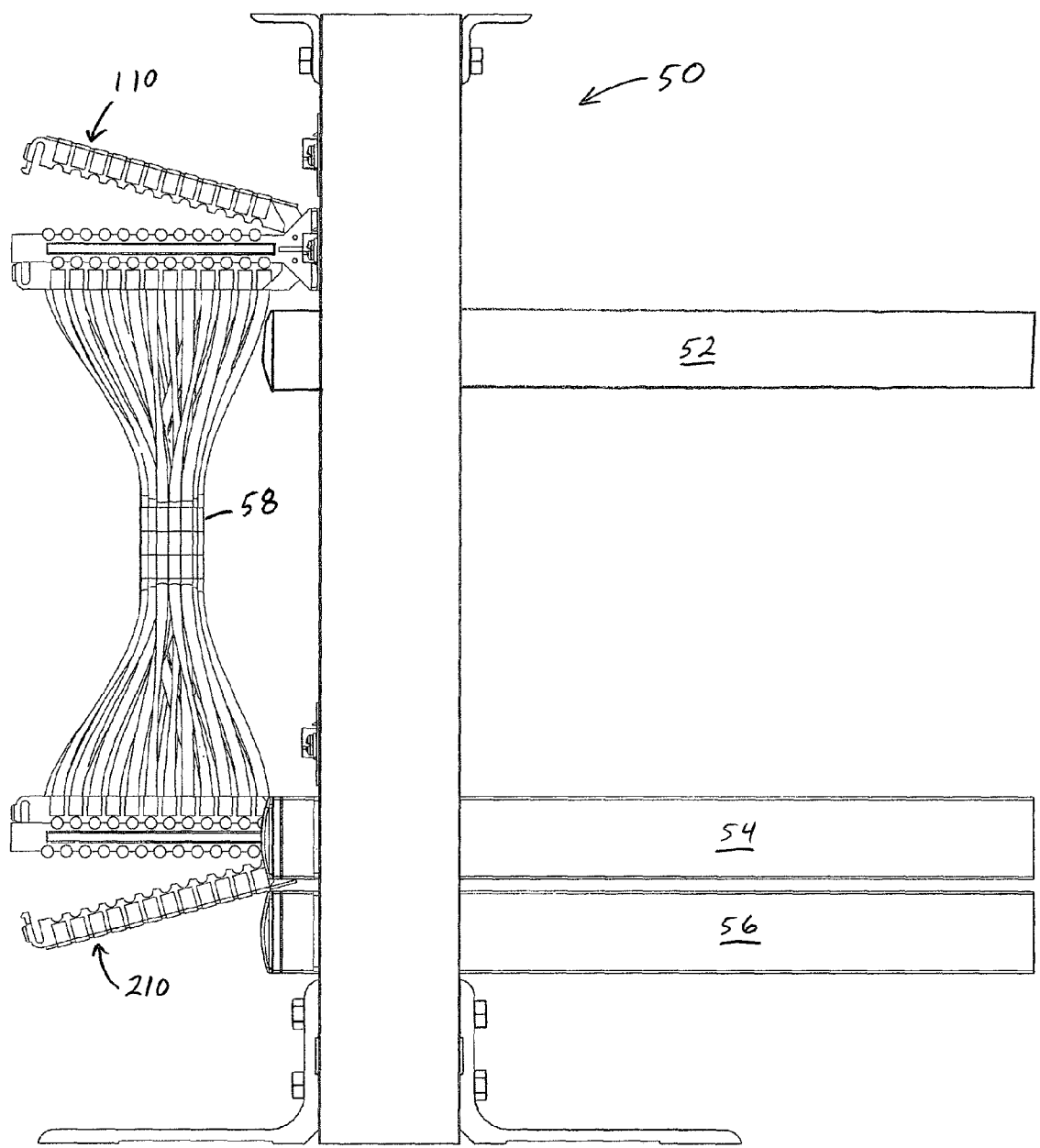
FIG. 3 illustrates an elevation view of an embodiment of a cable management arrangement in accordance with the principles of the present disclosure in association with a computer housing.

According to an embodiment of the present disclosure shown in FIGS. 1 through 3, a cable management device 10 is provided for managing a plurality of cables in a multi-cable environment. Cable management device 10 includes a stationary member 12 having a plurality of stationary channel portions 14. The stationary channel portions 14 are semi-cylindrical, having a cross-sectional width W that is adapted and constructed to accommodate standard data cables. As shown, the stationary channel portions 14 have a width of approximately ¼ inch, although it is contemplated that the stationary channel portions 14 could be provided with a width in a range from 1/16 inch to ½ inch, depending upon the specific application. The stationary member 12 is fabricated from a durable, relatively rigid material, such as a glass-filled nylon or a thermoplastic material. In the illustrated embodiment, the stationary member 12 is approximately 6½ inches long, and 1¾ inches by 1½ inches in cross-section. In the illustrated embodiment, each of the stationary channel portions 14 includes a front bracket 14a and a rear bracket 14b. The front and rear brackets 14a, 14b are arranged coaxially with one another, and are approximately ½ inches apart. A mounting mechanism 16 is provided to facilitate mounting of the device 10 onto a planar surface, such as a wall of a data equipment closet or cabinet. A stationary retaining clip 18 is also provided on as described below.

An upper movable member 20 is movably secured to the stationary member 12. As shown, the upper movable member 20 is secured for pivoting movement by a pivot pin 22 within a slot 24 formed in the stationary member 12. The upper movable member 20 is provided with a plurality of upper movable channel portions 26, corresponding in number and general configuration to the plurality of stationary channel portions 14. In FIG. 1, the movable member 20 is shown in a cable placement position, in which cables can be placed in the respective stationary channel portions. The upper movable member 20 can be fabricated from the same material as the stationary member 12. Alternatively, the upper movable member 20 can be fabricated from a material that is more resilient than the material from which the stationary member 12 is fabricated, thus allowing the upper movable channels 26 of the upper movable member 20 to provide a degree of "grip" to the cables held in the device 10. It is also contemplated that the upper movable member 20 can be fabricated from a combination of materials having individual desirable properties. In the illustrated embodiment, each of the upper movable channels 26 includes a front bracket 26a and a rear bracket 26b. The front and rear brackets 26a, 26b are arranged coaxially with one another, and are arranged slightly closer to one another than the brackets 14a, 14b. As shown, the brackets 26a, 26b are approximately ½ inch apart. An upper locking tab 28 is provided on the upper movable member 20. The upper locking tab 28 engages the stationary retaining clip 18 of the stationary member 12 to selectively lock the upper movable member 20 in a retaining position in which the cables are secured in channels formed by the cooperation of the stationary channel portions 14 and the movable channel portions 26, as shown in FIG. 2.

A lower movable member 30 is movably secured to the stationary member 12. As shown, the lower movable member 30 is secured for pivoting movement by a pivot pin 32 within a slot 34 formed in the stationary member 12. The lower movable member 30 is provided with a plurality of lower movable channel portions 36, corresponding in number and general configuration to the plurality of stationary channel portions 14. In FIG. 1, the lower movable member 30 is shown in a cable placement position, in which cables can be placed in the respective stationary channel portions. The lower movable member 30 can be fabricated from the same material as the stationary member 12. Alternatively, the lower movable member 30 can be fabricated from a material that is more resilient than the material from which the stationary member 12 is fabricated, thus allowing the lower movable channels 36 of the lower movable member 30 to provide a degree of "grip" to the cables held in the device 10. It is also contemplated that the lower movable member 30 can be fabricated from a combination of materials having individual desirable properties. In the illustrated embodiment, each of the lower movable channels 36 includes a front bracket 36a and a rear bracket 36b. The front and rear brackets 36a, 36b are arranged coaxially with one another, and are arranged slightly closer to one another than the brackets 14a, 14b. As shown, the brackets 36a, 36b are approximately ½ inch apart. A lower locking tab 38 is provided on the lower movable member 30. The lower locking tab 38 engages the stationary retaining clip 18 of the stationary member 12 to selectively lock the lower movable member 30 in a retaining position in which the cables are secured in channels formed by the cooperation of the stationary channel portions 14 and the movable channel portions 36, as shown in FIG. 2.

A plurality of indicia-bearing areas 40 are provided. In the illustrated embodiment, the indicia-bearing areas are located on the upper and lower movable members 20, 30. However, it is to be understood that the indicia-bearing areas can be located in any suitable visually accessible location on the device 10. The indicia-bearing areas 40 correspond in number to the respective channel portions 14, 26, 36, and are located adjacent to the channel portions 14, 26, 36 as well. The indicia-bearing areas 40 are adapted and constructed to receive indicia identifying the specific cable that is retained in a specific channel. It is contemplated that the indicia-bearing areas can be provided as labels, as defined surfaces for receiving indicia made with markers, as electronic displays, or as any other suitable indicia.

As shown in FIG. 3, a pair of cable management devices 110, 210 are secured to a data support structure 50. The data support structure 50 supports a plurality of devices 52, 54, 56, each of which presents multiple inputs for data cables 58. Each of the cable management devices 110, 210 is capable of retaining and identifying 24 cables. Thus, each cable connecting each device is retained and identified at its input and its output end.

Figure 4:
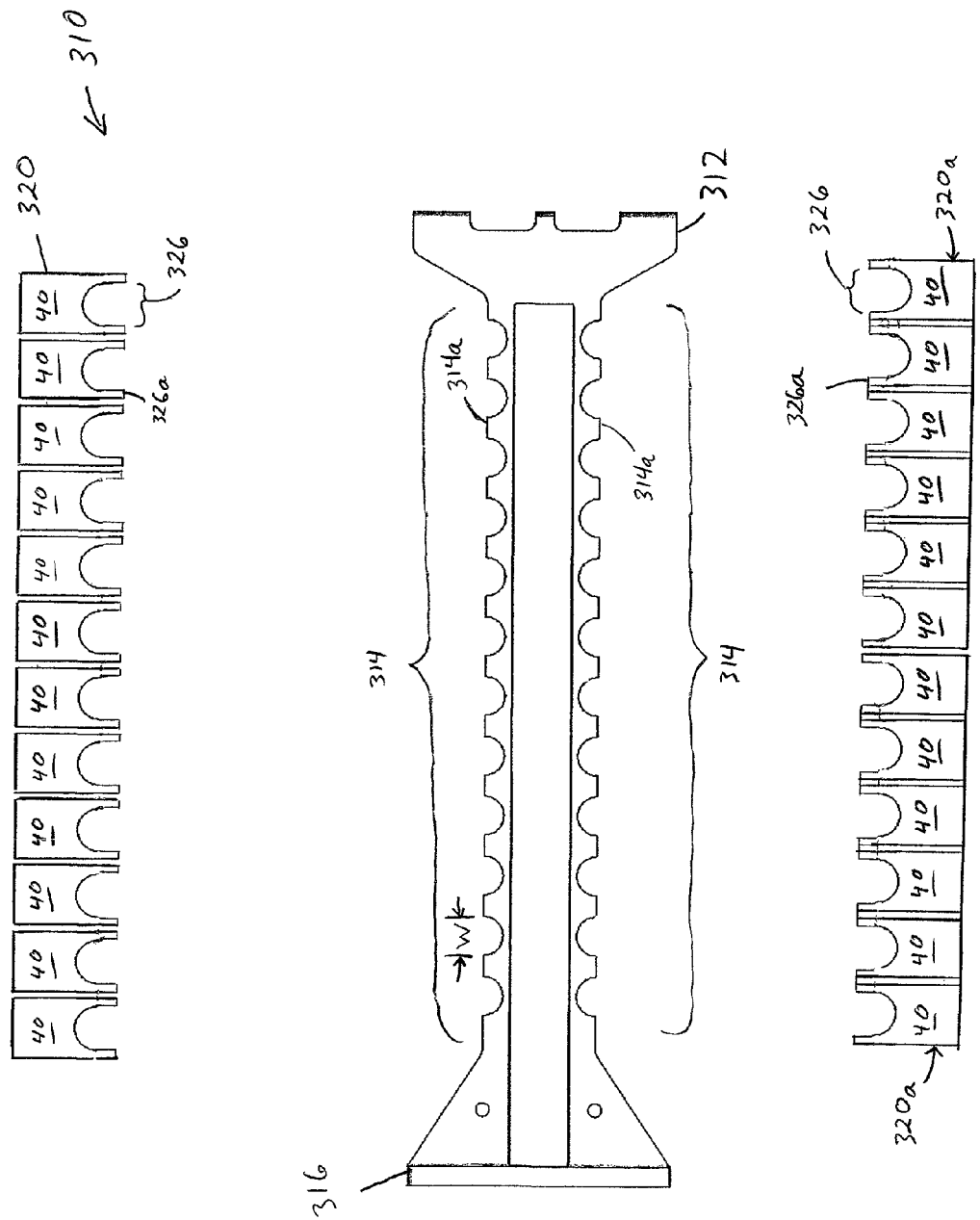
FIG. 4 illustrates an alternative embodiment of the cable management arrangement of the present disclosure.

Another embodiment of the present disclosure is shown in FIG. 4. This embodiment of a cable management device 310 also provides for management of a plurality of cables in a multi-cable environment. Cable management device 310 includes a stationary member 312 having a plurality of stationary channel portions 314. The stationary channel portions 314, as shown, are semi-cylindrical, having a cross-sectional width W that is adapted and constructed to accommodate standard data cables. As shown, the stationary channel portions 314 have a width of approximately ¼ inch, although it is contemplated that the stationary channel portions 314 could be provided with a width in a range from 1/16 inch to ½ inch, depending upon the specific application.

As shown in the exemplary embodiment, each of the stationary channel portions 314 includes a front bracket 314a and a rear bracket (not shown), similar to front and rear brackets 14a and 14b shown in FIG. 1. The front and rear brackets are arranged coaxially with one another and are approximately ½ inch apart. Cable management device 310 also includes a mounting bracket 316 to facilitate mounting the cable management device 310 onto a planar surface, such as a wall of a data equipment closet or cabinet.

A plurality of removable members 320 are removably secured to the stationary member 312. Each removable member 320 is provided with at least one channel portion 326, corresponding in general configuration with one of the plurality of stationary channel portions 314. Each removable member also includes a front bracket 326a and a rear bracket (not shown) positioned opposite the front bracket 326a. To secure an individual cable, a removable member 320 is inserted between a front bracket 314a and a rear bracket of the stationary member 312. Each removable member 320 is fabricated from a resilient material, allowing for a secure, yet removable interference fit between the front and rear brackets of removable member 320 and the front and rear brackets of stationary member 312. It should be understood that removable member 320 may be provided with one or more channel portions 326 depending on a particular application.

For example, referring to FIG. 4, a removable ember may be configured with a single channel portion. FIG. 4 shows twelve removable members 320, each configured with a single channel portion 326 for cooperation with a stationary channel portion 314 of stationary member 312. FIG. 4 also shows another example wherein removable members 320a are configured each with six channel portions 326 for cooperation with six corresponding stationary channel portions 314 of stationary member 312. As should be apparent, removable member 320 may be configured with a differing number of channel portions 326 depending on the application. Each removable member 320 may also include an indicia-bearing area 40 as described previously.

The embodiments disclosed, described and shown herein are for purposes of illustration only, and are to be construed as constituting any limitations of the invention. Modifications will be obvious to those skilled in the art, and all modifications that do not depart from the spirit of the claimed invention are intended to be included within the scope of the appended claims. Those skilled in the art will appreciate that the conception upon which this disclosure is based, may readily be utilized as a basis for the designing of other structures, methods and systems for carrying out the several purposes of the present claimed invention. It is important, therefore, that the claims be regarded as including such equivalent constructions insofar as they do not depart from the spirit and scope of the present invention.

With respect to the above description then, it is to be realized that the optimum dimensional relationships for the parts of the invention, including variations in size, materials, shape, form, function and manner of operation, assembly and use, and all equivalent relationships to those illustrated in the drawings and described in the specification, that would be deemed readily apparent and obvious to one skilled in the art, are intended to be encompassed by the present disclosure.

Therefore, the foregoing is considered as illustrative only of the principles of the claimed invention. Further, since numerous modifications and changes will readily occur to those skilled in the art, it is not desired to limit the claimed invention to the exact construction and operation shown and described, and accordingly, all suitable modifications and equivalents may be resorted to, falling within the scope of the claimed invention.

I claim:

1. A cable management device for managing a plurality of cables in a multi-cable environment, the device comprising the following:
   a stationary member having a plurality of stationary channel portions;
   a mounting mechanism secured to the stationary member;
   an upper movable member and a lower movable member, each movably secured to the stationary member, the upper and lower movable members each having a plurality of movable channel portions corresponding in number and general configuration to the plurality of stationary channel portions;
   a plurality of indicia-bearing areas located on the upper and lower movable members corresponding in number, and adjacent to the plurality of movable channel portions;
   whereby the upper and lower movable members are movable between a cable placement position in which cables can be placed in the respective stationary channel portions, and a cable retaining position in which the cables are secured in channels formed by the cooperation of the stationary channel portions and the movable channel portions.

2. A cable management device in accordance with claim 1, wherein the stationary member comprises a central stationary member secured between the upper movable member and the lower movable member.

3. A cable management device in accordance with claim 1, wherein the upper and lower movable members are pivotably secured to the stationary member.

4. A cable management device in accordance with claim 3, wherein the upper and lower movable members are each pivotably secured to the stationary member via a pivot pin.

5. A cable management device in accordance with claim 1, further comprising a locking mechanism adapted and constructed to maintain one of the upper movable member and the lower movable member in its cable retaining position.

6. A cable management device for managing a plurality of cables in a multi-cable environment, the device comprising:
   a stationary member having a plurality of stationary channel portions;
   at least one removable member removably secured to the stationary member, the at least one removable member having at least one removable channel portion corresponding in general configuration to one of the plurality of stationary channel portions;
   an indicia-bearing area located on the at least one removable member adjacent to the at least one removable channel portion;
   whereby the at least one removable member is configured to engage the stationary member such that a cable can be secured in a channel formed by the cooperation of one of the plurality of stationary channel portions and the at least one removable channel portion.

7. A cable management device in accordance with claim 6, further comprising a mounting mechanism secured to the stationary member.

8. A cable management device in accordance with claim 6, comprising a plurality of removable members, each of said removable members having a removable channel portion.

* * * * *